United States Patent [19]
Lawton et al.

[11] Patent Number: 5,667,937
[45] Date of Patent: Sep. 16, 1997

[54] METHOD OF SOLID IMAGING A PHOTOHARDENABLE COMPOSITION UTILIZING ARGON LASER AT 351 NM AND 364 NM

[75] Inventors: John Alan Lawton, Landenberg, Pa.; Jonathan V. Caspar, Greenville, Del.

[73] Assignee: E. I. Du Pont de Nemours and Company, Wilmington, Del.

[21] Appl. No.: 674,413

[22] Filed: Jul. 2, 1996

Related U.S. Application Data

[63] Continuation-in-part of Ser. No. 473,408, Jun. 7, 1995, abandoned.

[51] Int. Cl.⁶ ...................................................... G03F 7/20
[52] U.S. Cl. ........................... 430/270.1; 430/280.1; 430/281.1; 430/945; 522/15; 522/31
[58] Field of Search .................... 430/280.1, 281.1, 430/270.1, 945; 522/15, 31

[56] References Cited

U.S. PATENT DOCUMENTS

| | | | |
|---|---|---|---|
| 4,250,053 | 2/1981 | Smith | 252/426 |
| 4,624,912 | 11/1986 | Zweifel et al. | 430/258 |
| 5,055,439 | 10/1991 | Allen et al. | 502/158 |
| 5,101,415 | 3/1992 | Kolb et al. | 372/99 |
| 5,494,618 | 2/1996 | Sitzmann et al. | 264/401 |

*Primary Examiner*—Christopher G. Young

[57] ABSTRACT

A combination of a photoacid precursor and sensitizer for use with multiple wavelengths of an argon ion laser.

2 Claims, 1 Drawing Sheet

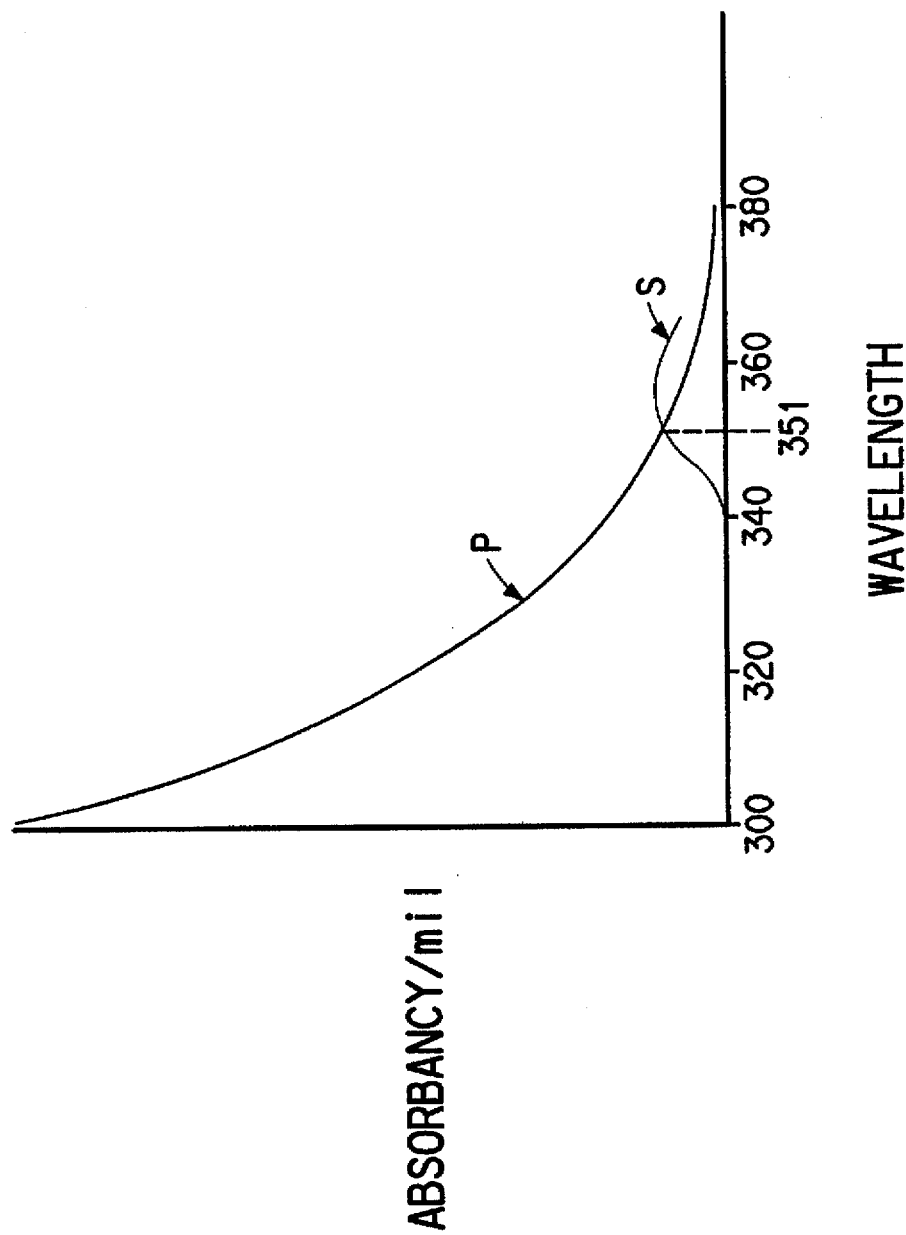

METHOD OF SOLID IMAGING A PHOTOHARDENABLE COMPOSITION UTILIZING ARGON LASER AT 351 NM AND 364 NM

This is a continuation-in-part of the earlier filed application Ser. No. 08/473,408 filed on Jun. 7, 1995 now abandoned.

BACKGROUND OF THE INVENTION

Sensitizers have been associated with photoacid precursors for the initiation of cationic photopolymerization. Generally this association allows for the photoacid precursor to be activated at a wavelength of radiant energy for which the photoacid precursor has low absorbance. The use of such sensitization of photoacid precursors for initiation of cationic polymerization, in particular polymerization of epoxy functional resins has been described in U.S. Pat. No. 5,055, 439 to Allen et al., U.S. Pat. No. 4,069,054 to Smith and, U.S. Pat. No. 4,250,053 to Smith. Recommended concentrations of the sensitizer are from 0.01 to 1 part by weight of photoacid precursor used for the polymerization. The concentrations of sensitizer taught, in particular for 1,6-diphenyl-1,3,5-hexatriene and 1,8-diphenyl-1,3,5,7-octatetraene, are excessive when sensitizing a triarylsulfonium photoacid precursor salt for use with an argon ion laser operating with two major wavelengths in the UV.

U.S. Pat. No. 4,624,912 to Zweifel et al. discloses numerous sensitizers, in particular 1,12-benzperylene, for use with photoacid precursors. Recommended concentrations of up to 10% by weight. Such concentrations of a sensitizer, such as 1,12-benzperylene, are excessive in solutions using triarylsulfonium salts, for applications using an argon ion laser in the UV, such as solid imaging, in which a depth of penetration greater than 2.5 mils is preferred.

In solid imaging or sterolithography, the thickness of a coating layer is, in some instances, only defined by the depth of penetration of the light below the surface of the liquid. For example in solid imaging using a cationically cured epoxy in a liquid mixture, the depth of the liquid may be much greater than the depth that is to be photohardened. This is particularly true in imaging of a cantilevered structure.

In cantilevered sections, the absorbance of the actinic radiation, to a given depth below the surface of the photopolymer, dictates the depth of layer polymerization. This depth of polymerization will depend upon the exposure and the ability of the photopolymer to reach a degree of insolubilization, due to polymerization. For a given exposure, at some point below the surface of the photopolymer, the absorbance of the actinic radiation by the initiator, is insufficient to induce polymerization such that the polymer formed is integral with the polymer at a lesser depth. At this point, the non-integral polymer may be dissolved in the deeper photopolymer medium, or the polymerization may be terminated, by oxygen, for example, in the case of free-radical polymerizations; or by the formation of a salt, for example, in cationic polymerizations. At higher or lower exposures, the depth of polymerization will be greater or lesser, respectively.

In a solid imaging system where a multi-wavelength laser or other light source is used, in order to achieve some degree of control in determining the depth of penetration and therefore, the depth of photohardening; the absorbances of the photoacid precursor and the sensitizer need be balanced. Otherwise the depth of photohardening from the penetration and activation of the light at one of the wavelengths of the multi-wavelength laser may extend far below the depth of penetration and activation of the other wavelengths.

The absorbance depth of the initiator(s) or sensitizers for the initiators, may be vastly different, or the actinic efficiency may occur at significantly different depths. For example, at a given exposure one wavelength of actinic radiation may cause a very small depth of polymerization while another wavelength may cause a very large depth of polymerization. In this case, the energy of the former wavelength is essentially wasted since the latter wavelength energy controls the depth of polymerization as a function of the exposure at that wavelength.

An imbalance in the penetration of the light may result in different depths of photohardening for each corresponding wavelength and can directly cause distortion and loss of tolerance in the imaged object.

The present invention provides a balanced concentration of photoacid precursor and sensitizer optimized for use with a multi-wavelength laser in the solid imaging process. In particular, the argon ion laser. The balanced absorbances (concentration times the molar extinction coefficient) of photoacid precursor and sensitizer provide a control of the depth of penetration of the light and thus the depth of photohardening at each major wavelength emitted by the laser so that a layer having high tolerance and low distortion can be efficiently imaged.

An objective of the present invention is to provide a combination of photoacid precursor and a sensitizer for use with the argon ion laser operating in the UV with at least two wavelengths which provide activation energy for the formation of the photoacid. The concentration and the absorption per mil of the photoacid precursor and the sensitizer are balanced such that the activity of the sensitized photoacid is approximately equal for at least two wavelengths.

SUMMARY OF THE INVENTION

In combination a photoacid precursor and a sensitizer for use with an argon ion laser operating in the UV at the wavelengths of 351 and 364 nm wherein the absorbance per mil at 351 nm of the photoacid precursor and the sensitizer are at least equal or if the absorbency per mil of the photoacid precursor and the sensitizer are not equal than the absorbance per mil of the sensitizer is less than that of the photoacid precursor and wherein the difference in the depth of penetration (Dp) at the two wavelengths is no greater than a factor of three.

The photoacid precursors of the present invention are triarylsulfonium salts combined with either 1,6-diphenyl hexatriene or 1,8-diphenyl octratetraene as the sensitizer or with the sensitizer 1,12-benzoperylene when the depth of penetration is at least 2.5 mils at both wavelengths 351 and 364 nm.

BRIEF DESCRIPTION OF THE DRAWINGS

The FIGURE shows the absorbance per mil of the photoacid precursor (p) and the sensitizer (S) adjusted to equal absorbance per mil at 351 nm.

DETAILED DESCRIPTION

When sensitizing a photoacid precursor solution, it is preferred that the majority of the absorption be direct absorption by the photoacid precursor. This is because direct absorption gives a greater quantum yield of acid product. When sensitizers are used, the quantum yield of the sensitization process is normally lower and the efficiency of acid generation suffers when compared to direct absorption by the photoacid precursor.

The absorbance per mil, for the purposes of the instant invention, is defined as the negative natural log of the fraction of incident energy transmitted by one mil of solution at a particular wavelength. The depth of penetration, Dp, is the inverse of the absorbance per mil. In depth regions greater than the Dp, the energy density absorbed by any volume increment falls off rapidly. Each can be calculated using the following formulas:

$$\text{Absorbance per mil} = (2.303 * \epsilon * \rho * C * 2.54 \times 10^{-3})/MW$$

$$Dp = 1/\Sigma \text{Absorbance per mil}$$

where, $\epsilon$ is the extinction coefficient of an absorber at a particular wavelength, $\rho$ is the physical density of the solution expressed as grams per liter, C is the weight fraction of the absorber in the solution, $2.54 \times 10^{-3}$ is a conversion factor (cm to mils), and MW is the molecular weight of the absorber. When calculating the depth of penetration, the absorbance per mil of all absorbers, actinic or non-actinic, must be summed. In most imaging applications, it is preferred that the depth of penetration be approximately equal to the thickness of the layer being imaged. In solid imaging applications, where most layer thickness are greater than 2.5 mils, a depth of penetration of 2.5 mils or greater is generally preferred.

In single wavelength systems it is generally possible to avoid the use of sensitizers, provided that the photoacid precursor has adequate absorption at the wavelength. A limitation occurs when the concentration of photoacid precursor becomes inordinately high in order to create the desired depth of penetration. As an example, suppose a photoacid precursor which is a mixture of triarylsulfonium hexafluoroantimonate salts (average molecular weight of 888) and 50% concentration by weight in propylene carbonate (available from Union Carbide as UVI-6974), is used in a photohardenable epoxy formulation (density 1140 g/liter) in a solid imaging application. For such an application, a desirable depth of penetration is approximately 6 mils. If the laser being used is an argon ion laser with an output wavelength of 351 nm, the concentration of the triarylsulfonium salts (extinction coefficient of 1264 at 351 nm) in the solution needs to be approximately 1.76% by weight. Alternatively if the laser output wavelength of 364 nm is used, the concentration of the salts (extinction coefficient of 175 at 364 nm) in the solution needs to be approximately 12.7% by weight. While the concentration of 1.76 for use with the 351 nm line is generally considered acceptable in the solid imaging formulations, a concentration of 12.7% for use with the 364 nm line would have significant deleterious effects on the physical properties of the objects made.

In two wavelength systems it is often not possible to have equal depth of penetration with both wavelengths without the use of a sensitizer. It is preferred in two wavelength systems that the sensitizer have the greatest absorption at a wavelength where the photoacid precursor has the least absorption. This allows the photoacid precursor to have the most direct absorption at the wavelength which it absorbs best and allows the sensitizer to compensate for the photoacid precursor's lack of absorption at the second wavelength. For example, following is a listing of various sensitizers that are somewhat ideal for use with an argon ion laser operating at the two wavelengths of 351 and 364 nm when UVI-6974 is the photoacid precursor. These sensitizers have a greater extinction coefficient at 364 nm than they do at 351 nm and, with the possible exception of octatetraene in an epoxy solution, they have little absorption above 400 nm. Sensitizers with little or no absorption above 400 nm are desirable in order to avoid stray visible light activation of the solution.

TABLE I

| Type | Absorber | Molecular Weight | Wavelength | Extinction Coefficient |
|---|---|---|---|---|
| Photoacid precursor | UVI-6974 | 888 | 351 | 1264 |
|  |  |  | 364 | 175 |
| Photoacid precursor | UVI-6990 | 737 | 351 | 828.3 |
|  |  |  | 364 | 95.6 |
| Sensitizer | 1,12-Benzoperylene | 276 | 351 | 9549 |
|  |  |  | 364 | 19850 |
| Sensitizer | 1,6-Diphenyl Hexatriene | 232 | 351 | 62770 |
|  |  |  | 364 | 76492 |
| Sensitizer | 1,8-Diphenyl Octratetraene | 258 | 351 | 41020 |
|  |  |  | 364 | 70709 |

All three sensitizers listed above have been found to enhance free radical polymerization in conjunction with a photoacid precursor, with or without the addition of a free radical photoinitiator. In the above table the extinction coefficients were measured in the following formulation:

| Epoxy Mixture | Mix % |
|---|---|
| Cyracure Resin UVR-6105 | 33.48 |
| Cyracure Resin UVR-6128 | 21.08 |
| EPON 1050 | 10.54 |
| Caprolactone Triol | 18.03 |
| Trimethylolpropane Triacrylate | 10.54 |
| Caprolactone Acrylate | 6.32 |

Cyracure Resin UVR-6105 and Cyracure Resin UVR-6128 are 3,4-epoxycyclohexylmethyl-3,4-epoxycyclohexane Carboxylate and Bis-(3,4-epoxycyclohexyl) Adipate respectively (Union Carbide). EPON 1050 is an epoxy phenol novolac resin having an epoxide equivalent weight of approximately 178 (Shell). The caprolactone triol has a number average molecular weight of 300 (Union Carbide). The Epoxy Mixture was used for background correction. Each sensitizer or photoacid precursor was added to the epoxy mixture to obtain a sample spectra. The samples were measured in neat form using a 0.1 mm spectrophotometer cell.

It is most preferred that the depth of penetration for the two wavelengths be equal. This ensures that the actinic effect of the photoacid precursor and the sensitizer occurs in a complimentary way through the thickness of the layer. However, if the depth of penetration between the two wavelengths is not exactly equal, it is preferred that the concentrations of the photoacid precursor and the sensitizer be chosen such that the absorbance per mil of the photoacid precursor is equal to or greater than the absorbance per mil of the sensitizer at the wavelength which the photoacid precursor absorbs best. While this is not always possible in situations where the photoacid precursor has little or no absorption at a wavelength generated by the exposure source, it is the preferred condition when using triarylsulfonium salts with an argon ion laser operating with the major wavelengths of 351 and 364 nm. The 333 nm line may be present but is not considered as a major wavelength for the purposes of this invention due to its low gain yielding less than 25% of the possible irradiance.

EXAMPLE 1

The following Example illustrates the maximum concentrations when an argon ion laser operating at 351 nm and 364 nm is used, and the photoacid precursor UVI-6974 and one of the sensitizers are comprised in the solution. The goal in each case is to have an average depth of penetration of 6 mils for the two wavelengths. Also, in the example below, the absorbance per mil of the photoacid precursor is set to be equal to the absorbance per mil of the sensitizer, as determined by the concentrations of each in the mixture, at the 351 nm wavelength. This would provide an efficient sensitization. In actual practice, it is more preferred that the sensitizer have less absorbance per mil than the photoacid precursor at 351 nm in order to have a greater efficiency of acid generation. While this may cause the Dp at the wavelength absorbed best by the sensitizer to increase, a Dp difference of a factor of 2 or 3 will provide acceptable performance in some systems such as solid imaging systems. This Dp difference defines the lower concentration limit for the sensitizer.

This concept is illustrated by FIG. 1 where the absorbance per mil of the photoacid precursor and the sensitizer are shown as a function of wavelength. At the 351 nm wavelength of the argon ion laser, the photoacid precursor has an absorbance per mil that is much greater than the absorbance per mil at 364 nm. The sensitizer is shown to have an absorbance per mil at 351 nm that is equal to that of the photoacid precursor. A greater concentration of sensitizer would cause the sensitizer to have a greater absorbance per mil than that of the photoacid precursor and would result in a lower efficiency of acid production from the 351 nm wavelength energy. Therefore, the condition shown, where the absorbance per mil of the sensitizer is equal to the absorbance per mil of the photoacid precursor, represents the maximum preferred concentration of the sensitizer relative to the photoacid precursor. The maximum concentration for the photoacid precursor and the sensitizer for use in solid imaging is further defined by the minimum preferred Dp of approximately 2.5 mils on average for the two wavelengths. At the 364 nm wavelength, the sensitizer is shown to have a greater absorbance per mil than that of the photoacid precursor. And the sum of the absorbance per mil of the photoacid precursor and the sensitizer at 364 nm will be less than the sum of their absorbance per mil at 351 nm. If the sensitizer concentration is reduced, the sum of the absorbance per mil at 364 nm will be even less than the sum at 351 nm. Since it is preferred that the maximum Dp difference be no greater than a factor of 3 between the two wavelengths, and since the Dp is the reciprocal of the sum of the absorbance per mil, a lower limit of sensitizer concentration is defined. In actual practice, it is more preferred that the sensitizer have less absorbance per mil than the photoacid precursor at 351 nm in order to have a greater efficiency of acid generation. Also, in actual practice it is more preferred that the Dp difference be less than a factor of 2 between the two wavelengths. These preferred conditions, where the Dp is greater than 2.5 mils and the absorbance per mil of the sensitizer is less than the absorbance per mil of the photoacid precursor at the precursors main absorption wavelength, and where the Dp difference, or the sum of the absorbance per mil for the two actinic absorbers, is less than 2 or 3, defines both the upper concentration limit and lower concentration limit, respectively, for the sensitizer in a solid imaging photopolymer system using an argon ion laser operating with at least two major wavelengths in the UV. For concentrations outside these preferred upper and lower ranges, problems such as inefficiencies in actinic energy usage, layer depth inaccuracies in the fabricated object, and premature viscosity increases of the photopolymer occur.

These concentration ranges are calculated in Tables III and IV for three sensitizers, Benzoperylene, 1,6-Diphenylhexatriene, and 1,8-Diphenyloctatetraene, and two photoacid precursors UVI-6974 and UVI-6990.

The percentages shown are by weight. The precursor salt is UVI-6974 and the weight percent is that of the salt not the solution.

TABLE III

| Sensitizer | Wavelength | Dp | % Sensitizer | % UVI-6974 | Sensitizer/ Precursor Ratio |
| --- | --- | --- | --- | --- | --- |
| Benzoperylene | 351 | 6.3 | 0.0344 | 0.84 | 0.041 |
|  | 364 | 5.7 |  |  |  |
| Benzoperylene | 351 | 2.6 | 0.0825 | 2.004 | 0.041 |
|  | 364 | 2.4 |  |  |  |
| Benzoperylene | 351 | 2.2 | 0.1 | 2.428 | 0.041 |
|  | 364 | 2.0 |  |  |  |
| 1,6-Diphenyl Hexatriene | 351 | 4.9 | 0.0057 | 1.09 | 0.005 |
|  | 364 | 7.1 |  |  |  |
| 1,8-Diphenyl Octatetraene | 351 | 5.8 | 0.0082 | 0.91 | 0.009 |
|  | 364 | 6.2 |  |  |  |

EXAMPLE 2

The following Example provides concentrations when another photoacid precursor UVI-6990 (Mixed Triarylsulfonium Hexafluorophosphate salts 50% by weight in propylene carbonate, Union Carbide) is used.

TABLE IV

| Sensitizer | Wavelength | Dp | % Sensitizer | % UVI-6974 | Sensitizer/ Precursor Ratio |
| --- | --- | --- | --- | --- | --- |
| Benzoperylene | 351 | 6.3 | 0.0346 | 1.06 | 0.033 |
|  | 364 | 5.7 |  |  |  |
| Benzoperylene | 351 | 2.6 | 0.0829 | 2.549 | 0.033 |
|  | 364 | 2.4 |  |  |  |
| Benzoperylene | 351 | 2.2 | 0.1 | 3.074 | 0.033 |
|  | 364 | 2.0 |  |  |  |
| 1,6-Diphenyl Hexatriene | 351 | 4.8 | 0.0058 | 1.39 | 0.004 |
|  | 364 | 7.2 |  |  |  |
| 1,8-Diphenyl Octatetraene | 351 | 5.7 | 0.0082 | 1.116 | 0.007 |
|  | 364 | 6.3 |  |  |  |

In both the above examples, the recommended sensitizer to precursor ratio is a maximum value and is independent of the depth of penetration. That is, the recommended maximum ratio of concentrations of sensitizer to triarylsulfonium salt photoacid precursor will be the same for all solid imaging systems using an argon ion laser exposure source operating with at least the major wavelengths of 351 and 364 nm, no matter what layer thickness is imaged or Dp is used. The photoacid precursor and sensitizer percent concentration by weight within the solution will depend upon the needed depth of penetration. For solid imaging systems employing an argon ion laser operating with the major wavelengths of 351 and 364 nm, using a cationically polymerizable photohardenable composition containing 1,12-benzoperylene and a triarylsulfonium salt, and requiring a depth of penetration greater than 2.2 mils, an efficient sensitization would require that the concentration of the benzoperylene be less than 0.1%.

The triarylsulfonium salts bearing non-nucleophilic anions of the type $ClO_4^-$, $BF_4^-$, $PF_6^-$, $SbF_6^-$, and $AsF_6^-$ are useful in carrying out the instant invention.

Thus, the present invention provides an improved method of solid imaging wherein a photohardenable composition containing an epoxy, a triarylsulfonium salt and a sensitizer is exposed to an argon ion laser operating in the UV at the wavelengths of 351 and 364 nm. The improvement comprises selecting the sensitizer and adjusting its concentration in the photohardenable composition such that the absorbance per mil at 351 nm of the sensitizer is less than or equal to that of the triarylsulfonium salt and the ratio of the concentration of the sensitizer to that of the triarylsulfonium salt is such that the difference in the depth of penetration (Dp) at the two wavelengths is no greater than a factor of three.

What is claimed is:

1. A method of solid imaging a photohardenable composition containing (a) an epoxy, (b) a photoacid precursor which is a triarylsulfonium salt and (c) a sensitizer selected from the group consisting of 1,12 benzoperylene, 1,6 diphenyl hexatriene and 1,8 diphenyl octratetraene by exposing said composition to an argon laser at wavelengths of both 351 nm and 364 nm with the proviso that
  (i) when the sensitizer is 1,12 benzoperylene its weight ratio to the salt is not greater than 0.041,
  (ii) when the sensitizer is 1,6 diphenyl hexatriene its weight ratio to the salt is not greater than 0.005, and
  (iii) when the sensitizer is 1,8 diphenyl octratetraene its weight ratio to the salt is not greater than 0.009.

2. The method of claim 1 wherein the sensitizer is 1,12-benzoperylene and the depth of penetration is at least 2.5 mils at both wavelengths.

* * * * *